United States Patent
Tachiyama

[11] Patent Number: 5,892,263
[45] Date of Patent: Apr. 6, 1999

[54] CMOS DEVICE CONNECTED TO AT LEAST THREE POWER SUPPLIES FOR PREVENTING LATCH-UP

[75] Inventor: Tsuyoshi Tachiyama, Tokyo, Japan

[73] Assignee: NEC Corporation, Tokyo, Japan

[21] Appl. No.: 784,789

[22] Filed: Jan. 16, 1997

[30] Foreign Application Priority Data

Jan. 18, 1996 [JP] Japan .................................. 8-006235

[51] Int. Cl.⁶ .............................. H01L 27/02; H01L 29/06
[52] U.S. Cl. ......................... 257/370; 257/372; 257/378; 257/546; 365/226
[58] Field of Search .................................. 257/370, 372, 257/369, 373, 375, 376, 546; 365/226

[56] References Cited

U.S. PATENT DOCUMENTS

| | | | |
|---|---|---|---|
| 4,302,875 | 12/1981 | Satou et al. ............................. | 257/370 |
| 4,672,584 | 6/1987 | Tsuji et al. ............................. | 365/226 |
| 4,797,724 | 1/1989 | Boler et al. ............................. | 257/370 |
| 5,126,816 | 6/1992 | Reczek et al. ......................... | 257/372 |
| 5,159,518 | 10/1992 | Roy ....................................... | 257/357 |
| 5,177,586 | 1/1993 | Ishimura et al. ...................... | 257/372 |
| 5,182,621 | 1/1993 | Hinooka ................................. | 257/369 |
| 5,338,986 | 8/1994 | Kurimoto ............................... | 257/373 |
| 5,406,513 | 4/1995 | Canaris et al. ........................ | 257/369 |
| 5,525,824 | 6/1996 | Himi et al. ............................. | 257/376 |
| 5,559,356 | 9/1996 | Yukawa ................................. | 257/369 |

FOREIGN PATENT DOCUMENTS

| | | |
|---|---|---|
| 64-61942 | 3/1989 | Japan . |
| 3-96272 | 4/1991 | Japan . |

*Primary Examiner*—Donald L. Monin, Jr.

[57] ABSTRACT

A complementary metal-oxide-semiconductor device having a semiconductor region of an n conductivity type connected to a high-potential power supply, in which a p-channel MOSFET is formed, and a semiconductor region of a p conductivity type connected to a low-potential power supply, in which an n-channel MOSFET is formed, characterized in that at least one of the following two states, that is, one state in which a source of said p-channel MOSFET is connected to a lower high-potential power supply having a potential lower than that of said high-potential power supply and another state in which a source of said n-channel MOSFET is connected to a higher low-potential power supply having a potential higher than that of said low-potential power supply is realized.

16 Claims, 6 Drawing Sheets

CMOS DEVICE CONNECTED TO AT LEAST THREE POWER SUPPLIES FOR PREVENTING LATCH-UP

BACKGROUND OF THE INVENTION

1. Field of the Invention

The present invention relates to a semiconductor device and, more particularly, to a complementary metal-oxide-semiconductor device (to be simply referred to as a CMOS device hereinafter) capable of preventing an abnormal operation called a latch-up phenomenon.

2. Description of the Prior Art

A CMOS device which constitutes a circuit by connecting p-channel MOSFETs and n-channel MOSFETs in series is a high-speed device with a low current consumption and used as the core device of a MOS semiconductor device. However, in the CMOS device of a single well scheme or double well scheme, a pnpn junction is inevitably formed in the device because of its structure. This device substantially has a serious problem such that this parasitic thyristor may be turned on to set the device in a latch-up state.

FIG. 1 is a sectional view of a general CMOS device. As shown in FIG. 1, an n-channel MOSFET (to be referred to as an nMOS hereinafter) having $n^+$ impurity regions 2 and 3, a $p^+$ impurity region 13 for applying a substrate potential, and an n-well 7 are formed in a p-type semiconductor substrate 8. $P^+$ impurity regions 4 and 5 serving as the source and drain regions of a p-channel MOSFET (to be referred to as a pMOS hereinafter) and an $n^+$ impurity region 6 for applying a substrate potential to the well are formed in the n-well 7. The $p^+$ impurity region 4 serving as the drain region of the pMOS and the $n^+$ impurity region 3 serving as the drain region of the nMOS are commonly connected to an output terminal OUT. The $p^+$ impurity region 5 serving as the source region of the pMOS and the $n^+$ impurity region 6 are commonly connected to a high-potential power supply $V_{DD}$. The $n^+$ impurity region 2 serving as the source region of the nMOS and the $p^+$ impurity region 13 are commonly connected to a low-potential power supply $V_{SS}$ (ground).

As shown in FIG. 1, a parasitic pnp transistor Q1, a parasitic npn transistor Q2, and parasitic resistances R1 and R2 are formed in this CMOS device. If one of the two parasitic transistors, e.g., the parasitic npn transistor Q2 is turned on due to some reason, the base potential of the parasitic pnp transistor Q1 is lowered. When the emitter-base path of this transistor is forward-biased, the parasitic pnp transistor Q1 is also turned on. A positive feedback loop constituted by the transistors Q1 and Q2 operates to flow a large current between the power supplies $V_{DD}$ and $V_{SS}$. With this operation, the device erroneously operates. In the worst case, thermal breakdown occurs.

Japanese Unexamined Patent Publication No. 3-96272 has proposed a technique in which a guard band is formed between the two MOSFETs as a means for preventing the latch-up phenomenon. FIGS. 2A and 2B are sectional and plan views, respectively, of a CMOS device proposed in this prior art. As shown in FIGS. 2A and 2B, a guard band 16 as an n-well is formed between an nMOS region 11 and a pMOS region 12. An $n^+$ impurity region 15 in this guard band 16 is connected to a power supply $V_{DD}$. A $p^+$ impurity region 14 formed in contact with a p-type semiconductor substrate 8 is connected to a low-potential power supply $V_{SS}$.

In the CMOS device having the above structure, a parasitic npn transistor Q2 and a dummy npn transistor Q3 having a base resistance lower than that of the parasitic npn transistor Q2 are connected in parallel with each other. With this structure, the dummy npn transistor Q3 can be turned on prior to the parasitic npn transistor Q2, so that the operation of the positive feedback loop constituted by a parasitic pnp transistor Q1 and the parasitic npn transistor Q2 is suppressed.

As a more reliable latch-up prevention means, a technique of isolating the pMOS with an insulating layer has been proposed in Japanese Unexamined Patent Publication No. 1-61942.

In the conventional CMOS device shown in FIGS. 2A and 2B, guard bands must be formed between all the pMOS regions and nMOS regions, resulting in an increase in chip area. In particular, when a large substrate current flows as in an IC having power elements mounted on the same substrate, the parasitic npn transistor Q2 is subsequently turned on after the dummy npn transistor is turned on. For this reason, it is difficult to prevent the latch-up phenomenon only by the use of the dummy npn transistor.

In the technique proposed in Japanese Unexamined Patent Publication No. 1-61942 in which the MOSFET is enclosed with an insulating layer, since the process becomes complex, and the manufacture process takes a long time, the yield decreases, and the manufacturing cost increases.

SUMMARY OF THE INVENTION

The present invention has been made to solve the above problems of the prior arts, and has as its object provide a CMOS device capable of properly preventing a latch-up phenomenon even when a large substrate current flows by using a means which can be easily manufactured without using a large chip area.

In order to achieve the above object, according to the basic aspect of the present invention, there is provided a complementary metal-oxide-semiconductor device having a semiconductor region of an n conductivity type connected to a high-potential power supply, in which a p-channel MOSFET is formed, and a semiconductor region of a p conductivity type connected to a low-potential power supply, in which an n-channel MOSFET is formed, characterized in that at least one of the following two states, that is, one state in which a source of the p-channel MOSFET is connected to a lower high-potential power supply having a potential lower than that of the high-potential power supply and another state in which a source of the n-channel MOSFET is connected to a higher low-potential power supply having a potential higher than that of the low-potential power supply is realized.

The voltage of the lower high-potential power supply or the voltage of the higher low-potential power supply described in the above basic aspect is a voltage divided by resistances connected between the high-potential power supply and the low-potential power supply.

The voltage of the lower high-potential power supply or the voltage of the higher low-potential power supply described in the above basic aspect is obtained by lowering the voltage of the high-potential power supply or by raising the voltage of the low-potential power supply by a resistance connected between the high-potential power supply and the lower high-potential power supply or by a resistance connected between the low-potential power supply and the higher low-potential power supply.

The semiconductor region of the n conductivity type or the semiconductor region of the p conductivity type is formed in the semiconductor region of the p conductivity type or in the semiconductor region of the n conductivity type described in the above basic aspect, a heavily doped diffusion layer of a p or n conductivity type having an annular shape is formed in a surface region of the semiconductor region of the p conductivity type or the semiconductor region of the n conductivity type to enclose the n-channel MOSFET or the p-channel MOSFET and the semiconductor region of the n conductivity type or the semiconductor region of the p conductivity type, and the diffusion layer of the p or n conductivity type is directly connected to the low-potential power supply or the high-potential power supply.

As can be seen from the above aspect, in the CMOS device of the present invention, the source of the pMOSFET is connected to the power supply having a potential lower than that of the high-potential power supply for applying a substrate potential to the n-well (n-type substrate), or the source of the nMOSFET is connected to the power supply having a potential higher than that of the low-potential powers supply for applying a substrate potential to the p-well (p-type substrate).

In the CMOS device of the present invention, the source of the nMOSFET is applied with a potential higher than that of the ground potential or the source of the pMOSFET is applied with a potential lower than the power supply potential. Since the base-emitter path of at least one of the transistors can be held in a reverse-biased state, a latch-up state can be prevented. In addition, the CMOS device of the present invention can be easily manufactured without using any special advanced technique and can prevent the latch-up phenomenon without requiring a large chip area. Therefore, a reliable CMOS device with a high degree of integration can be provided at a low cost.

The above and many other advantages, features and additional objects of the present invention will become manifest to those versed in the art upon making reference to the following detailed description and accompanying drawings in which preferred embodiments incorporating the principles of the present invention are shown by way of illustrative example.

DETAILED DESCRIPTION OF THE PREFERRED EMBODIMENTS

Preferred embodiments of the present invention will be described below with reference to the accompanying drawings.

Figure 3A:
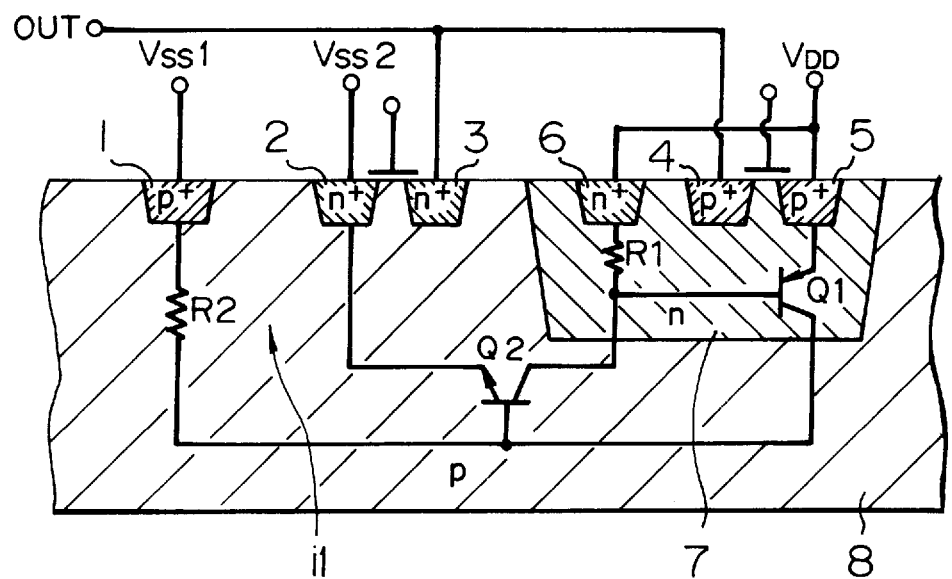
FIGS. 3A and 3B are sectional and plan views, respectively, showing the first embodiment of the present invention.
Figure 3B:
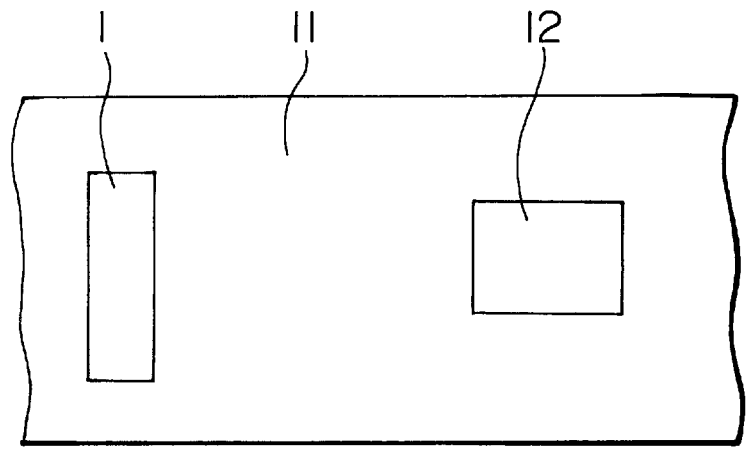

FIGS. 3A and 3B are sectional and schematic plan views, respectively, showing the first embodiment of the present invention. As shown in FIGS. 3A and 3B, an n-well 7 serving as a pMOS region 12 (FIG. 3B) is formed in a p-type semiconductor substrate 8. A $p^+$ impurity region 5 serving as the source region of the pMOS and a $p^+$ impurity region 4 serving as the drain region of the pMOS are formed in the surface region of the n-well 7. An $n^+$ impurity region 6 for applying a substrate potential to the well is also formed in the surface region of the n-well 7.

An $n^+$ impurity region 2 serving as the source region of an nMOS and an $n^+$ impurity region 3 serving as the drain region of the nMOS are formed in an nMOS region 11 (FIG. 3B) of the p-type semiconductor substrate. In addition, a $p^+$ impurity region 1 for applying the substrate potential to the p-type semiconductor substrate 8 is formed outside the NMOS region 11.

The $p^+$ impurity region 4 and the $n^+$ impurity region 3 are commonly connected to an output terminal OUT. The $p^+$ impurity region 5 and the $n^+$ impurity region 6 are commonly connected to a high-potential power supply $V_{DD}$. The $p^+$ impurity region 1 is connected to a low-potential power supply $V_{SS}1$. The $n^+$ impurity region 2 is connected to a higher low-potential power supply $V_{SS}2$ having a potential higher than that of the low-potential power supply $V_{SS}1$.

This CMOS device has a parasitic pnp transistor Q1 in which the $p^+$ impurity region 5 serves as an emitter, the $n^+$ impurity region 6 serves as a base, and the $p^+$ impurity region 1 serves as a collector, and a parasitic npn transistor Q2 in which the $n^+$ impurity region 2 serves as an emitter, the $p^+$ impurity region 1 serves as a base, and the $n^+$ impurity region 6 serves as a collector, so that a thyristor is formed. The bases of the parasitic transistors Q1 and Q2 have parasitic resistances R1 and R2, respectively.

In this embodiment, the $p^+$ impurity region 1 is connected to the low-potential power supply $V_{SS}1$ having a potential lower than that of the higher low-potential power supply $V_{SS}2$ to which the $n^+$ impurity region 2 is connected. For this reason, even when a substrate current i1 flows, the base-emitter path of the parasitic transistor Q2 is hardly forward-biased. Therefore, the parasitic transistor Q2 is prevented from being turned on, and the latch-up breakdown is improved.

Figure 4:
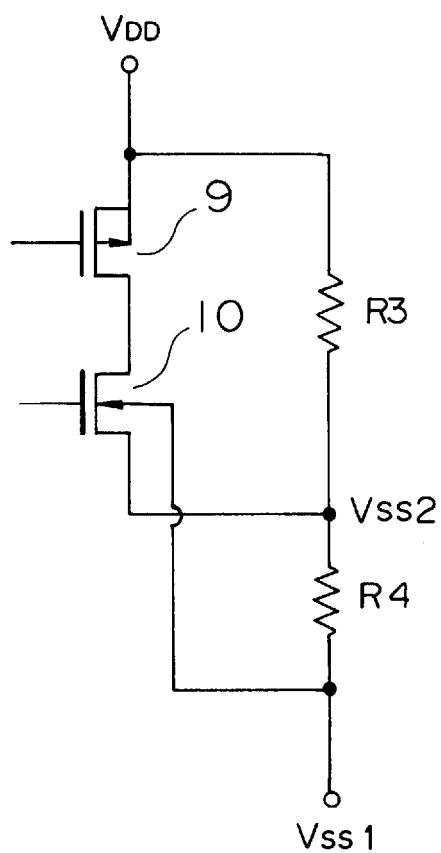
FIG. 4 is an equivalent circuit diagram showing an example of circuit connection of the first embodiment shown in FIGS. 3A and 3B.

FIG. 4 is an equivalent circuit diagram showing an example of circuit connection of the first embodiment. In this circuit, resistances R3 and R4 are connected between the high-potential power supply $V_{DD}$ and the low-potential power supply $V_{SS}1$. The voltage of the higher low-potential power supply $V_{SS}2$ is formed by the divided voltage. When a power supply voltage of 1.5 to 5 V is to be used, a voltage higher than that of the power supply $V_{SS}1$ by about 0.1 to 0.5 V is used as the voltage of the power supply $V_{SS}2$. The resistances R3 and R4 can be externally arranged or formed in the IC as diffused resistances or thin-film resistances using polysilicon or the like. These resistances need not always be formed for every circuit of the CMOS device and may be commonly used for a plurality of circuits of the CMOS device.

Figure 5A:
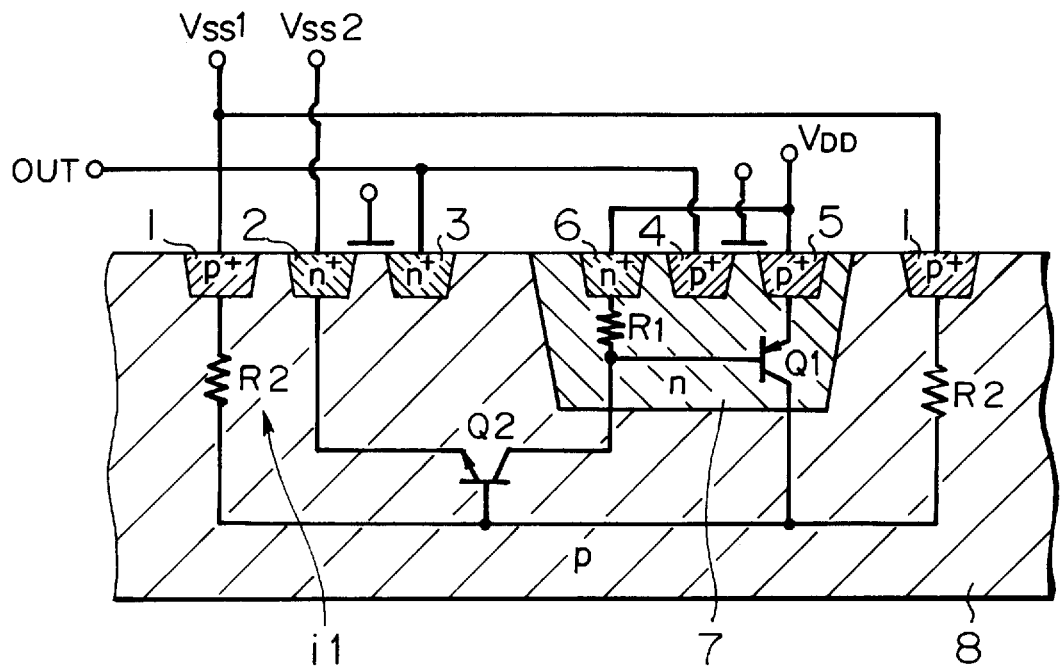
FIGS. 5A and 5B are sectional and plan views, respectively, showing the second embodiment of the present invention.
Figure 5B:
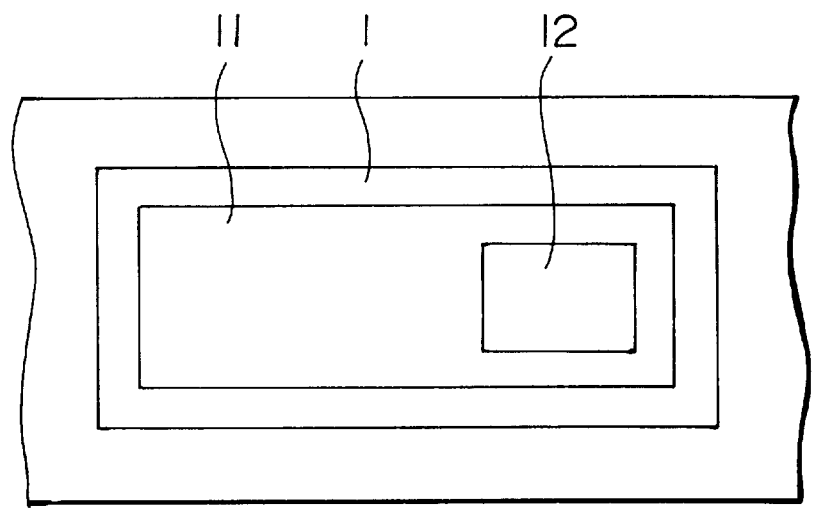

FIGS. 5A and 5B are sectional and schematic plan views, respectively, of the second embodiment of the present invention. As shown in FIG. 5B, this embodiment is different from the first embodiment in that a $p^+$ impurity region 1 is formed in an annular shape to entirely enclose an nMOS region 11 and a pMOS region 12.

In the CMOS device having the above structure, a substrate current i1 can be properly flowed into a power supply $V_{SS}1$ regardless of the direction of the current flowing in the CMOS device. Therefore, a latch-up phenomenon can be more properly prevented.

Figure 1:
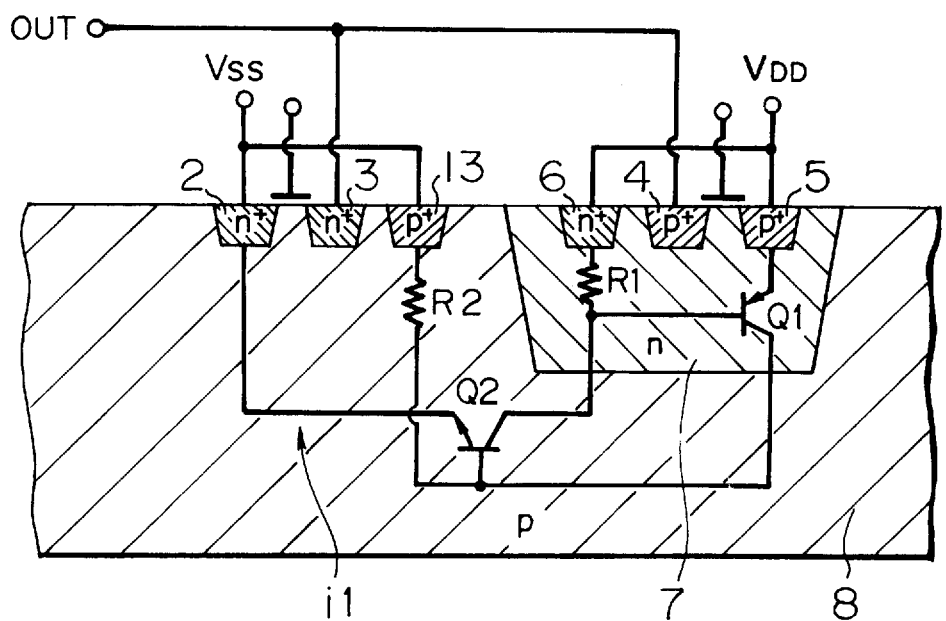
FIG. 1 is a sectional view of a conventional general CMOS device.
Figure 2A:
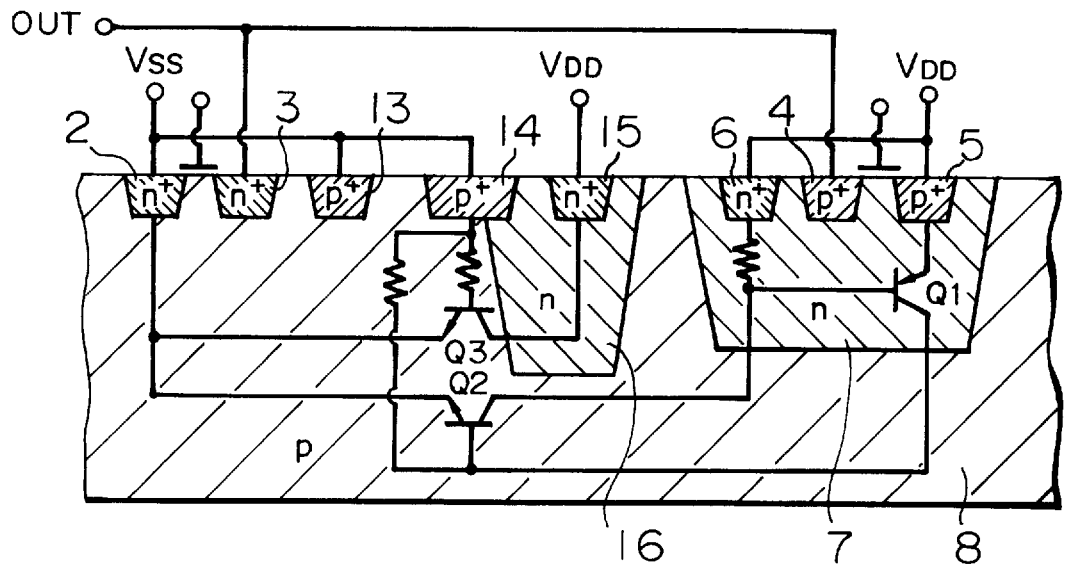
FIGS. 2A and 2B are sectional and plan views, respectively, of another conventional CMOS device to which a countermeasure against a latch-up phenomenon is applied.
Figure 2B:
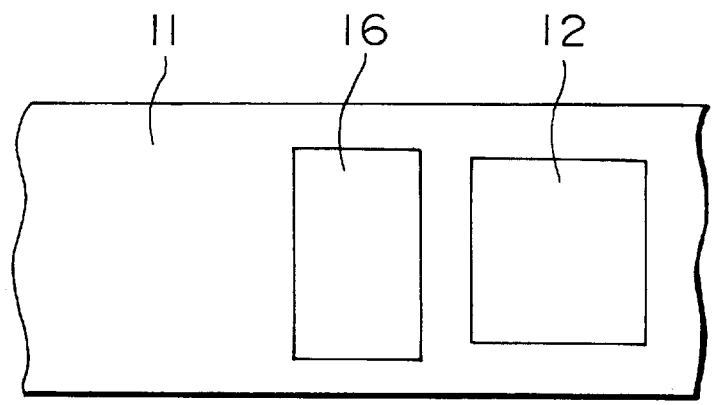
Figure 6:
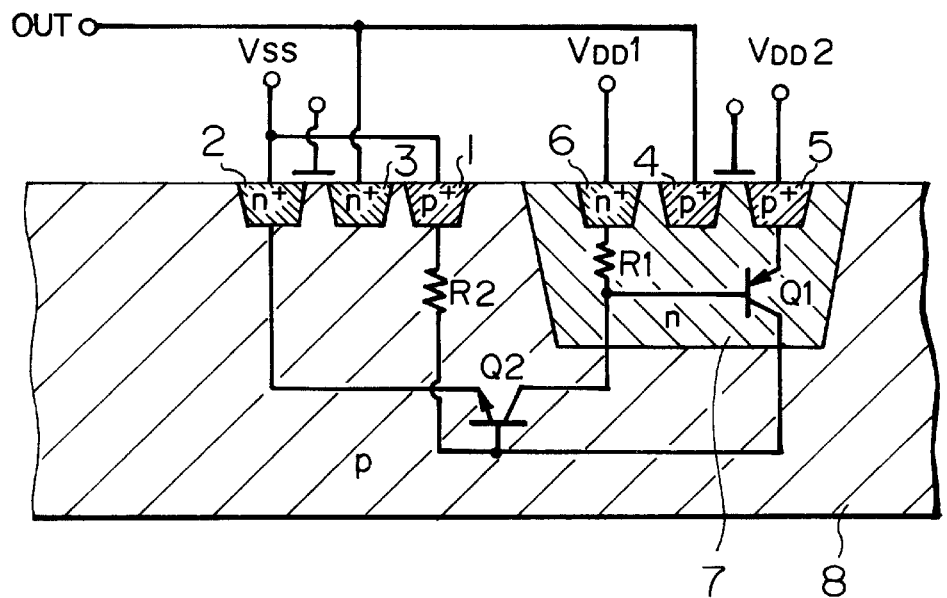
FIG. 6 is a sectional view showing the third embodiment of the present invention.

FIG. 6 is a sectional view showing the third embodiment of the present invention. This embodiment is different from the first embodiment shown in FIG. 1 in the following points. An n⁺ impurity region 2 serving as the source region of an nMOS and a p⁺ impurity region 1 for applying a substrate potential are commonly connected to a low-potential power supply $V_{SS}$. Instead, an n⁺ impurity region 6 for applying the substrate potential to the n-well is connected to a high-potential power supply Vssl, and a p⁺ impurity region 5 serving as a source region is connected to a lower high-potential power supply $V_{DD}2$.

In the CMOS device having the above structure, even when a transistor Q2 is turned on due to, e.g., a large substrate current, the base-emitter path of a transistor Q1 is hardly set in a forward-biased state and is prevented from being turned on. Therefore, when the cause for turning on the transistor Q2 is eliminated, the transistor Q2 is turned off, so no latch-up phenomenon occurs.

Figure 7:
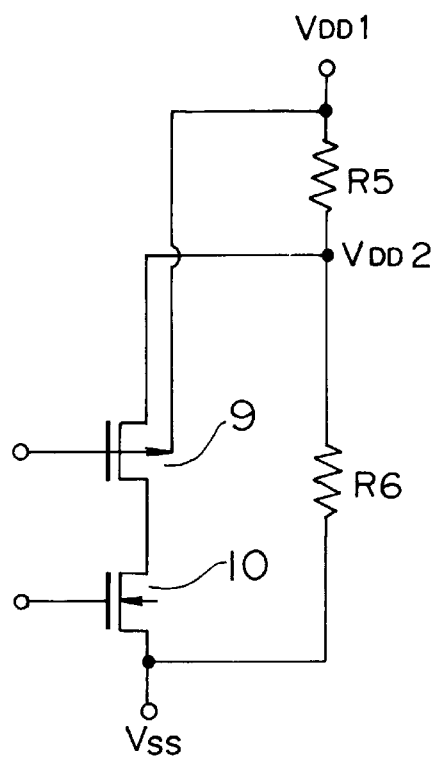
FIG. 7 is an equivalent circuit diagram showing an example of circuit connection of the third embodiment shown in FIG. 6.

FIG. 7 is an equivalent circuit diagram showing an example of circuit connection of the third embodiment. In this circuit, resistances R5 and R6 are connected between a high-potential power supply $V_{DD}1$ and the source of an nMOS 10, and the source of a pMOS 9 is connected to the connection point between the resistances R5 and R6, thereby obtaining the voltage of the lower high-potential power supply $V_{DD}2$. As the resistances R5 and R6 as well, external or internal resistances are used.

Although the preferred embodiments have been described above, the present invention is not limited to these embodiments, and various changes and modifications can be made within the scope and spirit of the invention as defined in the appended claims. For example, an n-type semiconductor substrate may be used, and accordingly, the conductivity types in the above embodiments may be reversed. The present invention can also be applied to a CMOS device having a double well structure. In the examples of circuit connection of the first and third embodiments, the power supply $V_{SS}2$ (or $V_{DD}2$) is formed by the voltage divided by the resistances R3 and R4 (or R5 and R6). However, to simplify the circuit arrangement, the resistance R3 (or R6) can be omitted.

What is claimed is:

1. A complementary metal-oxide-semiconductor device, comprising:
   a semiconductor region of an n conductivity type connected to a high-potential power supply, in which a p-channel MOSFET is formed;
   a semiconductor region of a p conductivity type connected to a low-potential power supply, in which an n-channel MOSFET is formed, wherein said semiconductor region of the n conductivity type is formed in said semiconductor region of the P conductivity type, a heavily doped diffusion layer of a P conductivity t y oe having an annular shape is formed in a surface region of the p conductivity type to enclose said n-channel MOSFET and said semiconductor region of then conductivity type, and said heavily do ped diffusion layer of the p conductivity type is directly connected to said low-potential power supply; and
   at least one of:
      a direct connection between a source of said p-channel MOSFET and a lower high-potential power supply having a potential lower than that of said high-potential power supply; and
      a direct connection between a source of said n-channel MOSFET and a higher low-potential power supply having a potential higher than that of said low-potential power supply.

2. A device according to claim 1, wherein a voltage of said lower high-potential power supply and a voltage of said higher low-potential power supply are voltages divided by resistances connected between said high-potential power supply and said low-potential power supply.

3. A device according to claim 1, wherein a voltage of said lower high-potential power supply is obtained by lowering a voltage of said high-potential power supply by connecting a resistance between said high-potential power supply and said low power supply.

4. A device according to claim 1, wherein a voltage of said higher low-potential power supply is obtained by raising a voltage of said low-potential power supply by connecting a resistance between said low-potential power supply and said high power supply.

5. A complementary metal-oxide-semiconductor, comprising
   a semiconductor region of an n conductivity type connected to a high-potential power supply, in which a p-channel MOSFET is formed;
   a semiconductor region of a p conductivity type connected to a low-potential power supply, in which an n-channel MOSFET is formed, wherein said semiconductor region of the p conductivity type is formed in said semiconductor region of the n conductivity type, a heaving doped diffusion layer of an n conductivity type having an annular shape is formed in a surface region of said semiconductor region of the n conductivity type to enclose said p-channel MOSFET and said semiconductor region of the p conductivity type, and said heavily doped diffusion layer of the n conductivity type is directly connected to said high-potential power supply; and
   at least one of:
      a direct connection between a source of said p-channel MOSFET and a lower high-potential sower supply having a potential lower than that of said high-potential power supply; and
      a direct connection between a source of said n-channel MOSFET and a higher low-potential power supply having a potential higher than that of said low-potential power supply.

6. In combination:
   a complementary metal-oxide-semiconductor (CMOS) device comprising:
      a semiconductor region of an n conductivity type in which a p-channel MOSFET is formed;
      and a semiconductor region of a p conductivity type in which an n-channel MOSFET is formed;
   a high-potential power supply external to said CMOS device and connected to said semiconductor region of an n conductivity type;
   a low-potential power supply external to said CMOS device and connected to said semiconductor region of a p conductivity type, wherein said semiconductor region of the p conductivity type is formed in said semiconductor region of the n conductivity type, a heaving doped diffusion layer of an n conductivity type having an annular shape is formed in a surface region of said semiconductor region of the n conductivity type to enclose said p-channel MOSFET and said semiconductor region of the p conductivity type, and said heavily doped diffusion layer of the n conductivity type is directly connected to said high-potential power supply; and at least one of:

a lower high-potential power supply that is external to said CMOS device, has a potential lower than that of said high-potential power supply and is directly connected to a source of said p-channel MOSFET; and a higher low-potential power supply that is external to said CMOS device, has a potential higher than that of said low-potential power sup ply and is directly connected to a source of said n-channel MOSFET.

7. The device according to claim 1, wherein said high-potential power supply, said low-potential power supply, said lower high-potential power supply, and said higher low-potential power supply are located external to said p-channel MOSFET and said n-channel MOSFET.

8. The device according to claim 2, wherein said resistances are located external to said p-channel MOSFET and said n-channel MOSFET.

9. The device according to claim 3, wherein said resistance is located external to said p-channel MOSFET and said n-channel MOSFET.

10. The device according to claim 4, wherein said resistance is located external to said p-channel MOSFET and said n-channel MOSFET.

11. The device according to claim 1, wherein said lower high-potential power supply is connected to said source of said p-channel MOSFET other than through said semiconductor region of an n conductivity type and said semiconductor region of a p conductivity type.

12. The device according to claim 1, wherein said higher low-potential power supply is connected to said source of said n-channel MOSFET other than through said semiconductor region of an n conductivity type and said semiconductor region of a p conductivity type.

13. In combination:
a complementary metal-oxide-semiconductor (CMOS) device comprising:
a semiconductor region of an n conductivity type in which a p-channel MOSFET is formed;
and a semiconductor region of a p conductivity type in which an n-channel MOSFET is formed;
a high-potential power supply external to said CMOS device and connected to said semiconductor region of an n conductivity type;

a low-potential power supply external to said CMOS device and connected to said semiconductor region of a p conductivity type, wherein said semiconductor region of the n conductivity type is formed in said semiconductor region of the p conductivity type, a heavily doped diffusion layer of a p conductivity type, having an annular shape is formed in a surface region of the p conductivity type to enclose said n-channel MOSFET and said semiconductor region of the n conductivity type, and said heavily doped diffusion layer of the p conductivity type is directly connected to said low-potential power supply; and at least one of:

a lower high-potential power supply that is external to said CMOS device, has a potential lower than that of said high-potential power supply and is directly connected to a source of said p-channel MOSFET; and a higher low-potential power supply that is external to said CMOS device, has a potential higher than that of said low-potential power supply and is directly connected to a source of said n-channel MOSFET.

14. The combination according to claim 13, wherein a voltage of said lower high-potential power supply and a voltage of said higher low-potential power supply are voltages divided by resistances, external to said p-channel MOSFET and said n-channel MOSFET, said resistances being connected between said high-potential power supply and said low-potential power supply.

15. The combination according to claim 13, wherein a voltage of said lower high-potential power supply is obtained by lowering a voltage of said high-potential power supply by providing a resistances, external to said p-channel MOSFET and said n-channel MOSFET, said resistance being connected between said high-potential power supply and said low-potential power supply.

16. The combination according to claim 13, wherein a voltage of said higher low-potential power supply is obtained by raising a voltage of said low-potential power supply by providing a resistance, external to said p-channel MOSFET and said n-channel MOSFET, said resistance being connected between said low-potential power supply and said high power supply.

* * * * *

UNITED STATES PATENT AND TRADEMARK OFFICE
CERTIFICATE OF CORRECTION

PATENT NO. : 5,892,263
DATED : April 6, 1999
INVENTOR(S) : Tsuyoshi TACHIYAMA

It is certified that error appears in the above-indentified patent and that said Letters Patent is hereby corrected as shown below:

Column 5, line 12, delete "Vss1" and insert --$V_{ss}1$--;

Column 5, line 56, delete "tyoe" and insert --type--; and

Column 5, line 60, delete "do ped" and insert --doped--.

Column 6, line 30, delete "heaving" and insert --heavily--; and

Column 6, line 63, delete "heaving" and insert -- heavily--.

Column 7, line 12, delete "sup ply" and insert --supply--.

Signed and Sealed this

Twelfth Day of October, 1999

*Attest:*

Q. TODD DICKINSON

*Attesting Officer*   Acting Commissioner of Patents and Trademarks